(12) United States Patent
Ahn et al.

(10) Patent No.: US 7,521,124 B2
(45) Date of Patent: Apr. 21, 2009

(54) SILICONES HAVING IMPROVED CHEMICAL RESISTANCE AND CURABLE SILICONE COMPOSITIONS HAVING IMPROVED MIGRATION RESISTANCE

(75) Inventors: Dongchan Ahn, Midland, MI (US); Pamela Jean Huey, Midland, MI (US); Nick Evan Shephard, Midland, MI (US); Michael John Watson, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 651 days.

(21) Appl. No.: 11/180,456

(22) Filed: Jul. 13, 2005

(65) Prior Publication Data

US 2005/0271884 A1 Dec. 8, 2005

Related U.S. Application Data

(63) Continuation-in-part of application No. 10/641,810, filed on Aug. 14, 2003, now abandoned.

(51) Int. Cl.
*C08G 77/24* (2006.01)

(52) U.S. Cl. ................... 428/447; 528/15; 528/31; 528/32; 528/42; 427/387; 156/329

(58) Field of Classification Search .............. 528/15, 528/31, 32, 42; 428/427; 427/387; 156/329
See application file for complete search history.

(56) References Cited

U.S. PATENT DOCUMENTS

| 2,676,182 A | 4/1954 | Daudt et al. ............ 260/448.2 |
| 3,159,601 A | 12/1964 | Ashby .................... 260/46.5 |
| 3,220,972 A | 11/1965 | Lamoreaux .............. 260/46.5 |
| 3,296,291 A | 1/1967 | Chalk et al. ............ 260/448.2 |
| 3,419,593 A | 12/1968 | Willing .................. 260/448.2 |
| 3,445,420 A | 5/1969 | Kookootsedes et al. ....... 260/37 |
| 3,516,946 A | 6/1970 | Modic .................... 252/429 |
| 3,814,730 A | 6/1974 | Karstedt ................. 260/46.5 |
| 3,975,362 A | 8/1976 | Kim et al. ............... 260/46.5 |
| 3,989,667 A | 11/1976 | Lee et al. ................ 260/46.5 |
| 3,989,668 A | 11/1976 | Lee et al. ................ 260/46.5 |
| 4,087,585 A | 5/1978 | Schulz ................... 260/37 |
| 4,273,902 A | 6/1981 | Tomioka et al. ........... 525/478 |
| 4,329,273 A | 5/1982 | Hardman et al. |
| 4,348,454 A | 9/1982 | Eckberg ................. 428/334 |
| 4,355,121 A | 10/1982 | Evans ................... 523/213 |
| 4,360,610 A | 11/1982 | Murray et al. ............ 523/212 |
| 4,370,358 A | 1/1983 | Hayes et al. ............. 427/54.1 |
| 4,386,170 A | 5/1983 | Monroe ................. 523/210 |
| 4,492,786 A | 1/1985 | Evans et al. ............. 524/865 |
| 4,500,447 A | 2/1985 | Kobayashi et al. ......... 252/511 |
| 4,584,355 A | 4/1986 | Blizzard et al. .......... 525/477 |
| 4,584,361 A | 4/1986 | Janik et al. .............. 528/15 |
| 4,585,836 A | 4/1986 | Homan et al. ............ 525/477 |
| 4,591,622 A | 5/1986 | Blizzard et al. .......... 525/477 |
| 4,707,531 A | 11/1987 | Shirahata ................. 528/12 |
| 4,766,176 A | 8/1988 | Lee et al. ................ 525/100 |
| 4,784,879 A | 11/1988 | Lee et al. .............. 427/213.34 |
| 4,818,805 A | 4/1989 | Ikeno et al. ............... 528/15 |
| 4,980,413 A | 12/1990 | Kasuya .................. 524/730 |
| 5,017,654 A | 5/1991 | Togashi et al. ............ 525/100 |
| 5,036,117 A | 7/1991 | Chung et al. ............. 522/172 |
| 5,091,135 A | 2/1992 | Okada et al. |
| 5,120,810 A | 6/1992 | Fujiki et al. ............... 528/15 |
| 5,175,325 A | 12/1992 | Brown et al. .............. 556/9 |
| 5,194,649 A | 3/1993 | Okawa ................... 556/451 |
| 5,204,436 A | 4/1993 | Kishita et al. ............. 528/15 |
| 5,248,715 A | 9/1993 | Gray et al. ............... 524/265 |
| 5,254,623 A * | 10/1993 | Watson .................. 525/100 |
| 5,302,632 A | 4/1994 | Maxson .................. 523/213 |

(Continued)

FOREIGN PATENT DOCUMENTS

EP 0 370 689 11/1989

(Continued)

OTHER PUBLICATIONS

Abstract CA2009072, 19900820, Kasuya, A., Adhesion promoter for curable organopolysiloxane compsns.—exhibiting excellent adhesion to organic and inorganic substrates in the cured form, C08K-005/10.
Abstract JP06172654, 19940621, Shinetsu Chem. Ind. Co. Ltd., Organopolysiloxane compsn. with strong adhesion—comprises alkenyl gp.-contg. organopolysiloxane with at least one silicon-linked flourine-contg. substit., C08L-083/08.
Abstract JP06256660, 19940913, Shinetsu Chem. Ind. Co. Ltd., Fluoro silicone ruber compsn. of good compatibility of polysiloxane components—contg. specified fluoropolysiloxane, per fluoroalkyl gp. contg. siloxane, epoxy gp. contg. hydrogen polysiloxane, and platinum@ based catalyst, C08L-083/07.
Abstract JP06329916A, Nov. 29, 1994, Shin Etsu Chem. Co. Ltd., Organopolysiloxane Composition, C08L 83/07.
Abstract JP02123162A, May 10, 1990, Shin Etsu Chem. Co. Ltd., Curable Organopolysiloxane Composition, C08L 83/07.

*Primary Examiner*—Margaret G Moore
(74) *Attorney, Agent, or Firm*—Catherine U. Brown (57) ABSTRACT

A composition is prepared by mixing components including: (I) a polyorganosiloxane having an average of at least two unsaturated organic groups per molecule, with the proviso that component (I) is free of fluorine atoms; optionally (II) an organohydrogenpolysiloxane having an average of at least two silicon-bonded hydrogen atoms per molecule, with the proviso that component (II) is free of fluorine atoms; (III) a hydrosilylation catalyst; (IV) a fluoroorganosilicone, with the provisos that (1) component (IV) has at least one functional group reactive with component (I), component (II), or both, (2) when component (II) is not present, then component (IV) has an average of at least two silicon-bonded hydrogen atoms per molecule, and (3) component (IV) is added to the composition in an amount sufficient to provide chemical resistance to a cured product of the composition; and (V) an adhesion promoter.

14 Claims, 2 Drawing Sheets

U.S. PATENT DOCUMENTS

| | | | |
|---|---|---|---|
| 5,310,843 A | 5/1994 | Morita | 528/15 |
| 5,349,037 A | 9/1994 | Fujiki et al. | 528/15 |
| 5,399,602 A | 3/1995 | Matsushita et al. | 524/267 |
| 5,405,929 A | 4/1995 | Kobayashi | 528/15 |
| 5,447,987 A | 9/1995 | Sato et al. | 524/731 |
| 5,482,775 A | 1/1996 | Miyabayashi | 428/391 |
| 5,578,381 A | 11/1996 | Hamada et al. | 428/447 |
| 5,616,403 A | 4/1997 | Eckberg et al. | 428/215 |
| 5,665,794 A | 9/1997 | Maxson et al. | 523/209 |
| 5,684,060 A | 11/1997 | Konings et al. | 523/109 |
| 5,696,211 A * | 12/1997 | Chung et al. | 525/478 |
| 5,744,507 A | 4/1998 | Angell et al. | 521/86 |
| 5,756,598 A | 5/1998 | Chung et al. | 525/478 |
| 5,777,047 A * | 7/1998 | Chung et al. | 525/478 |
| 5,824,736 A | 10/1998 | Kobayashi et al. | 524/588 |
| 5,989,719 A | 11/1999 | Loiselle | 428/447 |
| 6,004,679 A * | 12/1999 | Mitchell et al. | 428/446 |
| 6,056,976 A | 5/2000 | Markkula et al. | 424/486 |
| 6,074,703 A | 6/2000 | Eckberg et al. | 427/387 |
| 6,169,142 B1 | 1/2001 | Nakano et al. | 524/862 |
| 6,201,092 B1 | 3/2001 | Hara | |
| 6,362,554 B1 | 3/2002 | Neal | |
| 6,685,855 B1 | 2/2004 | Miller et al. | |
| 6,794,035 B2 | 9/2004 | Tobita et al. | |
| 2002/0014810 A1 | 2/2002 | Maruyama | |
| 2002/0032270 A1 | 3/2002 | Azechi | 524/492 |
| 2002/0137842 A1 | 9/2002 | Sato et al. | 525/100 |
| 2003/0071382 A1 | 4/2003 | Neal | |
| 2005/0038183 A1 | 2/2005 | Ahn et al. | 524/861 |
| 2005/0038217 A1 | 2/2005 | Ahn et al. | 528/15 |
| 2005/0271884 A1 | 12/2005 | Ahn et al. | |
| 2006/0014915 A1 | 1/2006 | Ahn et al. | |

FOREIGN PATENT DOCUMENTS

| | | |
|---|---|---|
| EP | 0384352 A2 | 8/1990 |
| EP | 0493791 A1 | 12/1991 |
| EP | 0347895 B1 | 11/1993 |
| EP | 0596534 A2 | 5/1994 |
| EP | 0 655 483 | 11/1994 |
| EP | 0661335 A1 | 7/1995 |
| EP | 0497349 B1 | 6/1996 |
| EP | 0 655 471 B1 | 2/1997 |
| EP | 0 590 595 B1 | 10/1997 |
| EP | 0802234 A2 | 10/1997 |
| EP | 0 850 999 A2 | 1/1998 |
| EP | 0850997 A2 | 7/1998 |
| EP | 0934981 A2 | 8/1999 |
| EP | 0985710 A1 | 3/2000 |
| EP | 0 503 975 B1 | 11/2001 |
| EP | 1172414 A2 | 1/2002 |
| EP | 1 006 145 B1 | 2/2003 |
| EP | 1 148 098 B1 | 5/2003 |
| EP | 1 264 865 B1 | 5/2004 |
| GB | 2300861 A | 11/1996 |
| JP | 63-48901 | 5/1983 |
| JP | 11005902 | 1/1999 |
| JP | 11035828 | 2/1999 |
| JP | 2000-078679 | 5/2000 |

* cited by examiner

SILICONES HAVING IMPROVED CHEMICAL RESISTANCE AND CURABLE SILICONE COMPOSITIONS HAVING IMPROVED MIGRATION RESISTANCE

CROSS REFERENCE

This application is a continuation in part of U.S. patent application Ser. No. 10/641,810, filed on 14 Aug. 2003 now abandonded and claims priority thereto under 35 U.S.C. §120 and 35 U.S.C. §365(c). U.S. patent application Ser. No. 10/641,810 is hereby incorporated by reference.

TECHNICAL FIELD

This invention relates to curable silicone compositions and silicones formed by curing the curable silicone compositions. More particularly, this invention relates to hydrosilylation-curable compositions having improved resistance to Bleed. The curable silicone compositions cure to form products having improved chemical resistance and resistance to Bleed.

BACKGROUND OF THE INVENTION

Polyorganosiloxane elastomers, such as polydimethylsiloxane-based elastomers, are frequently used in the electronics industry for properties such as their thermal stability and ability to relieve stresses over a broad thermal range. However, these polyorganosiloxane elastomers may suffer from the drawback of poor resistance to some organic chemicals, such as solvents and engine oils.

Fluorosilicone elastomers and organic elastomers have been used to improve chemical resistance. However, fluorosilicone elastomers suffer from the drawback of having higher cost than polyorganosiloxane elastomers (that are non-fluorinated). One proposed approach to address this is to combine fluorosilicone elastomers with polyorganosiloxane elastomers. However, proposed approach has generally not been used due to concerns that the fluorosilicone and non-fluorinated organosilicone components would phase separate, resulting in unstable properties.

Silicone compositions that cure to form elastomers may also suffer from the drawback of poor resistance to Bleed. Bleed can be problematic in applications in which the composition is applied to a portion of a substrate before curing. The species that Bleed (out of the silicone composition) may contaminate the substrate. This tends to be particularly problematic for adhesives, such as die attach adhesives used in electronics applications, because the addition of adhesion promoters to hydrosilylation-reaction curable polyorganosiloxane elastomer compositions has been found to increase Bleed.

Organic elastomers may suffer from the drawback of having insufficient flexibility or bulk thermal properties. Therefore, there is a need in the electronics industry for curable silicone compositions having improved resistance to Bleed, where the curable silicone compositions cure to form elastomers having improved chemical resistance and resistance to Bleed, while retaining flexibility and bulk thermal properties.

SUMMARY OF THE INVENTION

This invention relates to a composition prepared by mixing components comprising:
(I) a polyorganosiloxane having an average of at least two unsaturated organic groups per molecule,
optionally (II) an organohydrogenpolysiloxane having an average of at least two silicon-bonded hydrogen atoms per molecule,
(III) a hydrosilylation catalyst;
(IV) a fluoroorganosilicone; and
(V) an adhesion promoter.

Component (I) is free of fluorine atoms. Component (II) is free of fluorine atoms. Component (IV) has at least one functional group reactive with component (I), component (II), or both. When component (II) is not present, the component (IV) has an average of at least two silicon-bonded hydrogen atoms per molecule. Components (IV) and (V) are present in amounts sufficient to improve resistance to Bleed.

DETAILED DESCRIPTION OF THE INVENTION

All amounts, ratios, and percentages are by weight unless otherwise indicated. The following is a list of definitions, as used herein.

Definitions and Usage of Terms

"A" and "an" each mean one or more.

"Bleed" means an undesirable tendency for species to move across the interface of a silicone composition or cured product thereof. Bleed includes movement of species out of the silicone composition, or cured product thereof, onto, for example, a substrate on which the silicone composition, or cured product thereof, is applied. Bleed further includes movement of species into the silicone composition, or cured product thereof, from outside of the silicone composition, or cured product thereof.

"Chemical resistance" means reduced tendency of a silicone to swell, or degrade, or both, when exposed to solvents and oils.

"Combination" means two or more items put together by any method.

The abbreviation "cP" means centipoise.

The abbreviation "IR" means infrared.

"Migration" means the tendency of fluorine-containing species to move toward the interface of a silicone composition or a cured product thereof, without crossing the interface, thereby enriching the content of fluorine-containing species at the interface as compared to the bulk.

The abbreviation "mm" means millimeters.

"Pa.s" means Pascal seconds.

The abbreviation "ppm" means parts per million.

"Silicone" and "siloxane" are used interchangeably herein.

This invention relates to a composition prepared by mixing components comprising:
(I) a polyorganosiloxane having an average of at least two unsaturated organic groups per molecule,
   with the proviso that component (I) is free of fluorine atoms;
optionally (II) an organohydrogenpolysiloxane having an average of at least two silicon-bonded hydrogen atoms per molecule,
   with the proviso that component (II) is free of fluorine atoms;
(III) a hydrosilylation catalyst;
(IV) a fluoroorganosilicone,
   with the provisos that
     i) component (IV) has at least one functional group reactive with component (I), component (II), or both, and
     ii) when component (II) is not present, then component (IV) has an average of at least two silicon-bonded hydrogen atoms per molecule, and; and
(V) an adhesion promoter.

Component (I) Polyorganosiloxane

Component (I) is a polyorganosiloxane having an average of at least two unsaturated organic groups per molecule. Component (I) may have a linear, branched, or resinous structure. Component (I) may be a homopolymer or a copolymer. The unsaturated organic groups may be alkenyl groups having from 2 to 12 carbon atoms and are exemplified by, but not limited to, vinyl, allyl, butenyl, and hexenyl. The unsaturated organic groups may be alkynyl groups having 2 to 12 carbon atoms, and are exemplified by, but not limited to, ethynyl, propynyl, and butynyl. Alternatively, the unsaturated organic groups may contain acrylate-functional or methacrylate-functional groups and are exemplified by, but not limited to, acryloyloxyalkyl such as acryloyloxypropyl and methacryloyloxyalkyl such as methacryloyloxypropyl. The unsaturated organic groups in component (I) may be located at terminal, pendant, or both terminal and pendant positions.

The remaining silicon-bonded organic groups in component (I) may be monovalent organic groups free of aliphatic unsaturation. These monovalent organic groups may have 1 to 20 carbon atoms, alternatively 1 to 10 carbon atoms, and are exemplified by, but not limited to alkyl such as methyl, ethyl, propyl, pentyl, octyl, undecyl, and octadecyl; cycloalkyl such as cyclohexyl; aryl such as phenyl, tolyl, xylyl, benzyl, and 2-phenylethyl; and cyano-functional groups such as cyanoalkyl groups exemplified by cyanoethyl and cyanopropyl. Component (I) is free of fluorine atoms.

The viscosity of component (I) is not specifically restricted, however, component (I) may have a viscosity of 0.05 to 500 Pa.s at 25° C., alternatively 0.1 to 200 Pa.s at 25° C. Component (I) is added to the composition in an amount of 100 weight parts.

Component (I) may comprise a polyorganosiloxane of the formula
(a) $R^1_3SiO(R^1_2SiO)_\alpha(R^1R^2SiO)_\beta SiR^1_3$,
(b) $R^3_2R^4SiO(R^3_2SiO)_\chi/(R^3R^4SiO)_\delta SiR^3_2R^4$, or
(c) a combination thereof.

In formula (a), $\alpha$ has an average value of 0 to 2000, and $\beta$ has an average value of 2 to 2000. Each $R^1$ is independently a monovalent organic group. Suitable monovalent organic groups include, but are not limited to, acrylic functional groups such as acryloyloxypropyl and methacryloyloxypropyl; alkyl groups such as methyl, ethyl, propyl, and butyl; alkenyl groups such as vinyl, allyl, and butenyl; alkynyl groups such as ethynyl and propynyl; aromatic groups such as phenyl, tolyl, and xylyl; and cyanoalkyl groups such as cyanoethyl and cyanopropyl. Each $R^2$ is independently an unsaturated monovalent organic group. $R^2$ is exemplified by alkenyl groups such as vinyl, allyl, and butenyl and alkynyl groups such as ethynyl and propynyl, and acrylic functional groups such as acryloyloxypropyl and methacryloyloxypropyl.

In formula (b), $\chi$ has an average value of 0 to 2000, and $\delta$ has an average value of 0 to 2000. Each $R^3$ is independently a monovalent organic group. Suitable monovalent organic groups include, but are not limited to, acrylic functional groups such as acryloyloxypropyl and methacryloyloxypropyl; alkyl groups such as methyl, ethyl, propyl, and butyl; alkenyl groups such as vinyl, allyl, and butenyl; alkynyl groups such as ethynyl and propynyl; aromatic groups such as phenyl, tolyl, and xylyl; and cyanoalkyl groups such as cyanoethyl and cyanopropyl. Each $R^4$ is independently an unsaturated organic hydrocarbon group. $R^4$ is exemplified by alkenyl groups such as vinyl, allyl, and butenyl; alkynyl groups such as ethynyl and propynyl; and acrylic functional groups such as acryloyloxypropyl and methacryloyloxypropyl.

Component (I) may comprise polydiorganosiloxanes such as
i) dimethylvinylsiloxy-terminated polydimethylsiloxane,
ii) dimethylvinylsiloxy-terminated poly(dimethylsiloxane/methylvinylsiloxane),
iii) dimethylvinylsiloxy-terminated polymethylvinylsiloxane,
iv) trimethylsiloxy-terminated poly(dimethylsiloxane/methylvinylsiloxane),
v) trimethylsiloxy-terminated polymethylvinylsiloxane,
vi) dimethylvinylsiloxy-terminated poly(dimethylsiloxane/methylphenylsiloxane),
vii) dimethylvinylsiloxy-terminated poly(dimethylsiloxane/diphenylsiloxane),
viii) phenyl,methyl,vinyl-siloxy-terminated polydimethylsiloxane,
ix) dimethyl-acryloyloxypropyl-siloxy-terminated polydimethylsiloxane,
x) dimethyl-methacryloyloxypropyl-siloxy-terminated polydimethylsiloxane,
xi) dimethylhexenylsiloxy-terminated polydimethylsiloxane,
xii) dimethylhexenylsiloxy-terminated poly(dimethylsiloxane/methylhexenylsiloxane),
xiii) dimethylhexenylsiloxy-terminated polymethylhexenylsiloxane,
xiv) trimethylsiloxy-terminated poly(dimethylsiloxane/methylhexenylsiloxane),
xv) dimethylvinylsiloxy-terminated poly(dimethylsiloxane/methylcyanopropylsiloxane), and
xvi) combinations thereof.

Methods of preparing polydiorganosiloxanes suitable for use as component (I), such as hydrolysis and condensation of the corresponding organohalosilanes or equilibration of cyclic polydiorganosiloxanes, are well known in the art.

Component (I) may comprise resins such as an MQ resin consisting essentially of $R^5_3SiO_{1/2}$ units and $SiO_{4/2}$ units, a TD resin consisting essentially of $R^5SiO_{3/2}$ units and $R^5_2SiO_{2/2}$ units, an MT resin consisting essentially of $R^5_3SiO_{1/2}$ units and $R^5SiO_{3/2}$ units, an MTD resin consisting essentially of $R^5_3SiO_{1/2}$ units, $R^5SiO_{3/2}$ units, and $R^5_2SiO_{2/2}$ units, or a combination thereof.

Each $R^5$ is a monovalent organic group. The monovalent organic groups represented by $R^5$ may have 1 to 20 carbon atoms, alternatively 1 to 10 carbon atoms. Examples of monovalent organic groups include, but are not limited to, acrylate functional groups such as acryloxyalkyl groups, methacrylate functional groups such as methacryloxyalkyl groups, cyano-functional groups, and monovalent hydrocarbon groups. Monovalent hydrocarbon groups include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl. Cyano-functional groups include, but are not limited to cyanoalkyl groups such as cyanoethyl and cyanopropyl.

The resin may contain an average of 3 to 30 mole percent of unsaturated organic groups. The unsaturated organic groups may be alkenyl groups, alkynyl groups, acrylate-functional groups, methacrylate-functional groups, or combinations thereof. The mole percent of unsaturated organic groups in the resin is the ratio of the number of moles of unsaturated group-containing siloxane units in the resin to the total number of moles of siloxane units in the resin, multiplied by 100.

Methods of preparing resins are well known in the art. For example, resin may be prepared by treating a resin copolymer produced by the silica hydrosol capping process of Daudt et al. with at least an alkenyl-containing endblocking reagent. The method of Daudt et al., is disclosed in U.S. Pat. No. 2,676,182.

Briefly stated, the method of Daudt et al. involves reacting a silica hydrosol under acidic conditions with a hydrolyzable triorganosilane such as trimethylchlorosilane, a siloxane such as hexamethyldisiloxane, or mixtures thereof, and recovering a copolymer having M and Q units. The resulting copolymers generally contain from 2 to 5 percent by weight of hydroxyl groups.

The resin, which typically contains less than 2 percent by weight of silicon-bonded hydroxyl groups, may be prepared by reacting the product of Daudt et al. with an unsaturated organic group-containing endblocking agent and an endblocking agent free of aliphatic unsaturation, in an amount sufficient to provide from 3 to 30 mole percent of unsaturated organic groups in the final product. Examples of endblocking agents include, but are not limited to, silazanes, siloxanes, and silanes. Suitable endblocking agents are known in the art and exemplified in U.S. Pat. Nos. 4,584,355; 4,591,622; and 4,585,836. A single endblocking agent or a mixture of such agents may be used to prepare the resin.

Component (I) can be a single polyorganosiloxane or a combination comprising two or more polyorganosiloxanes that differ in at least one of the following properties: structure, viscosity, average molecular weight, siloxane units, and sequence.

Component (II) Organohydrogenpolysiloxane

Component (II) is an organohydrogenpolysiloxane having an average of at least two silicon-bonded hydrogen atoms per molecule. Component (II) can be can be a homopolymer or a copolymer. Component (II) can have a linear, branched, cyclic, or resinous structure. The silicon-bonded hydrogen atoms in the component (II) can be located at terminal, pendant, or at both terminal and pendant positions. Component (II) is free of fluorine atoms.

Component (II) can comprise siloxane units including, but not limited to, $HR^6_2SiO_{1/2}$, $R^6_3SiO_{1/2}$, $HR^6SiO_{2/2}$, $R^6_2SiO_{2/2}$, $R^6SiO_{3/2}$, and $SiO_{4/2}$ units. In the preceding formulae, each $R^6$ is independently selected from monovalent organic groups free of aliphatic unsaturation.

Component (II) may comprise a compound of the formula
(a) $R^7_3SiO(R^7_2SiO)_\epsilon(R^7HSiO)_{100}SiR^7_3$, or
(b) $R^8_2HSiO(R^8_2SiO)_\gamma R^8HSiO)_\eta SiR^8_2H$,
(c) a combination thereof.

In formula (a), $\epsilon$ has an average value of 0 to 2000, and $\phi$ has an average value of 2 to 2000. Each $R^7$ is independently a monovalent organic group free of aliphatic unsaturation. Suitable monovalent organic groups free of aliphatic unsaturation include alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl.

In formula (b), $\gamma$ has an average value of 0 to 2000, and $\eta$ has an average value of 0 to 2000. Each $R^8$ is independently a monovalent organic group free of aliphatic unsaturation. Suitable monovalent organic groups free of aliphatic unsaturation include alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl.

Component (II) is exemplified by
i) dimethylhydrogensiloxy-terminated polydimethylsiloxane,
ii) dimethylhydrogensiloxy-terminated poly(dimethylsiloxane/methylhydrogensiloxane),
iii) dimethylhydrogensiloxy-terminated polymethylhydrogensiloxane,
iv) trimethylsiloxy-terminated poly(dimethylsiloxane/methylhydrogensiloxane),
v) trimethylsiloxy-terminated polymethylhydrogensiloxane,
vi) a resin consisting essentially of $H(CH_3)_2SiO_{1/2}$ units and $SiO_{4/2}$ units, and
vii) combinations thereof.

Component (II) can be a combination of two or more organohydrogenpolysiloxanes that differ in at least one of the following properties: structure, average molecular weight, viscosity, siloxane units, and sequence.

Methods of preparing linear, branched, and cyclic organohydrogenpolysiloxanes suitable for use as component (II), such as hydrolysis and condensation of organohalosilanes, are well known in the art. Methods of preparing organohydrogenpolysiloxane resins suitable for use as component (II) are also well known as exemplified in U.S. Pat. Nos. 5,310,843; 4,370,358; and 4,707,531.

The molar ratio of silicon-bonded hydrogen atoms in component (II) to aliphatically unsaturated groups in component (I) ($SiH_B/Vi_A$) is not critical.

Component (III) Hydrosilylation Catalyst

Component (III) is a hydrosilylation catalyst. Component (III) is added to the composition in an amount of 0.1 to 1000 ppm of platinum group metal, alternatively 1 to 500 ppm, alternatively 2 to 200, alternatively 5 to 150 ppm, based on the weight of the composition. Suitable hydrosilylation catalysts are known in the art and commercially available. Component (III) may comprise a platinum group metal selected from platinum, rhodium, ruthenium, palladium, osmium or iridium metal or organometallic compound thereof, or a combination thereof. Component (III) is exemplified by compounds such as chloroplatinic acid, chloroplatinic acid hexahydrate, platinum dichloride, and complexes of said compounds with low molecular weight organopolysiloxanes or platinum compounds microencapsulated in a matrix or coreshell type structure. Complexes of platinum with low molecular weight organopolysiloxanes include 1,3-diethenyl-1,1,3,3-tetramethyldisiloxane complexes with platinum. These complexes may be microencapsulated in a resin matrix.

Suitable hydrosilylation catalysts for component (III) are described in, for example, U.S. Pat. Nos. 3,159,601; 3,220,972; 3,296,291; 3,419,593; 3,516,946; 3,814,730; 3,989,668; 4,784,879; 5,036,117; and 5,175,325 and EP 0 347 895 B. Microencapsulated hydrosilylation catalysts and methods of preparing them are known in the art, as exemplified in U.S. Pat. No. 4,766,176 and the references cited therein; and U.S. Pat. No. 5,017,654.

Component (IV) Fluoroorganosilicone

Component (IV) is a fluoroorganosilicone having at least one functional group reactive with component (I), component (II), or both. When component (II) is not present in the composition, the component (IV) has an average of at least two silicon-bonded hydrogen atoms per molecule. The viscosity of component (IV) is not specifically restricted, however, component (IV) may have a viscosity of 0.0001 to 500 Pa.s at 25° C.

Component (IV) may comprise a compound of the formula:
(a) $R^9_3SiO(R^9_2SiO)_\iota R^9R^{10}SiO)_\phi SiR^9_3$,
(b) $R^{11}_2R^{12}SiO(R^{11}_2SiO)_\kappa(R^{11}R^{12}SiO)_\lambda SiR^{11}_2R^{12}$,
(c) $F_3C(CF_2)_\nu R^{13}-Si-[O-Si(R^{14})_2(R^{15})]_3$, (d) a resinous or branched structure consisting essentially of $R^{15}R^{14}{}_2SiO_{1/2}$ units, $CF_3(CF2)_vR^{13}SiO_{3/2}$ units, and optionally $SiO_{4/2}$ units, or (e) a combination thereof.

In formula (a) ι has an average value of 0 to 2000, and φ has an average value of 1 to 500. Each $R^9$ is independently a hydrogen atom or a monovalent organic group. Suitable monovalent organic groups include monovalent hydrocarbon groups that are free of aliphatic unsaturation such as alkyl groups such as methyl, ethyl, propyl, and butyl; aromatic groups such as phenyl, tolyl, and xylyl; and cyano-functional groups exemplified by cyanoalkyl groups such as cyanoethyl and cyanopropyl. Suitable monovalent organic groups also include unsaturated monovalent organic groups exemplified by acrylate functional groups; methacrylate functional groups; alkenyl groups such as vinyl, allyl, and butenyl; and alkynyl groups such as ethynyl, propynyl, and butynyl. In formula (a) at least one $R^9$ is a hydrogen atom or an unsaturated monovalent organic group. Each $R^{10}$ is independently a fluoro-functional organic group. Suitable fluoro-functional organic groups include, but are not limited to, fluorinated alkyl groups such as 3,3,3-trifluoropropyl, 4,4,4,3,3-pentafluorobutyl, 5,5,5,4,4,3,3-heptafluoropentyl, and 6,6,6,5,5,4,4,3,3-nonafluorohexyl.

In formula (b) κ has an average value of 0 to 2000, and λ has an average value of 0 to 500. Each $R^{11}$ is independently a hydrogen atom or a monovalent organic group. Suitable monovalent organic groups include cyano-functional groups exemplified by cyanoalkyl groups such as cyanoethyl and cyanopropyl; and monovalent hydrocarbon groups free of aliphatic unsaturation, exemplified by alkyl groups such as methyl, ethyl, propyl, and butyl; and aromatic groups such as phenyl, tolyl, and xylyl. Suitable monovalent organic groups also include unsaturated monovalent organic groups exemplified by acrylate functional groups; methacrylate functional groups; alkenyl groups such as vinyl, allyl, and butenyl; and alkynyl groups such as ethynyl, propynyl, and butynyl. In formula (b) at least one $R^{11}$ is a hydrogen atom or an unsaturated monovalent organic group. Each $R^{12}$ is independently a fluoro-functional organic group. Suitable fluoro-functional organic groups include fluorinated alkyl groups such as 3,3,3-trifluoropropyl, 4,4,4,3,3-pentafluorobutyl, 5,5,5,4,4,3,3-heptafluoropentyl, and 6,6,6,5,5,4,4,3,3-nonafluorohexyl.

In formulae (c) and (d), v is 0 to 10. Each $R^{13}$ is independently a divalent organic group such as a divalent hydrocarbon group. Suitable divalent organic groups for $R^{13}$ may have at least 2 carbon atoms, alternatively, 2 to 20 carbon atoms, alternatively 2 to 10 carbon atoms. Examples of suitable divalent hydrocarbon groups for $R^{13}$ include alkylene groups such as methylene, ethylene, propylene, and butylene. Each $R^{14}$ is independently a monovalent hydrocarbon group free of aliphatic unsaturation. $R^{14}$ is exemplified by alkyl such as methyl, ethyl, propyl, pentyl, octyl, undecyl, and octadecyl; cycloalkyl such as cyclohexyl; and aryl such as phenyl, tolyl, xylyl, benzyl, and 2-phenylethyl. Each $R^{15}$ is independently a hydrogen atom or an aliphatically unsaturated hydrocarbon group exemplified by alkenyl such as vinyl, allyl, butenyl, and hexenyl; and alkynyl such as ethynyl, propynyl, and butynyl. If one $R^{15}$ is an aliphatically unsaturated hydrocarbon group, then all $R^{15}$ in the molecule may be the same or different aliphatically unsaturated hydrocarbon group. If one $R^{15}$ in a molecule is a hydrogen atom, then all $R^{15}$ may be hydrogen atoms.

Component (IV) is exemplified by
i) dimethylvinylsiloxy-terminated polymethyl3,3,3-trifluoropropyl siloxane,
ii) dimethylvinylsiloxy-terminated poly(methylhydrogensiloxane/methyl-6,6,6,5,5,4,4,3,3-nonafluorohexylsiloxane),
iii) trimethylsiloxy-terminated poly(methylhydrogensiloxane/methyl-6,6,6,5,5,4,4,3,3-nonafluorohexylsiloxane), and
iv) combinations thereof.

Alternatively, compoinent (IV) is exemplified by
i) dimethylvinylsiloxy-terminated polymethyl3,3,3-trifluoropropyl siloxane,
ii) dimethylvinylsiloxy-terminated poly(methylhydrogensiloxane/methyl-6,6,6,5,5,4,4,3,3-nonafluorohexylsiloxane),
iii) trimethylsiloxy-terminated poly(methylhydrogensiloxane/methyl-6,6,6,5,5,4,4,3,3-nonafluorohexylsiloxane),
iv) trimethylsiloxy-terminated poly(methylhydrogensiloxane/methyl-3,3,3-trifluoropropylmethyl-6,6,6,5,5,4,4,3,3-nonafluorohexylsiloxane),
v) trimethylsiloxy-terminated poly(methylvinylsiloxane/methyl-6,6,6,5,5,4,4,3,3-nonafluorohexylsiloxane) or
vi) combinations thereof.

Component (IV) is added to the composition in an amount sufficient to provide resistance to Bleed and chemical resistance to a cured silicone prepare by curing the composition. Component (IV) may be added to the composition an amount of 0.01 to 100 parts by weight based on the weight of component (I). Without wishing to be bound by theory, it is thought that the halogenated portion of component (IV) migrates to the surface of the composition when cured. It is thought that sufficient chemical resistance and resistance to Bleed for many applications can be obtained without adding a higher amount of component (IV), which would dramatically increase the cost of the composition.

Component (IV) can be a combination of two or more fluoroorganosilicones that differ in at least one of the following properties: structure, average molecular weight, viscosity, siloxane units, and sequence.

Fluoroorganosilicones suitable for use as component (IV) are known in the art. Fluoroorganosilicones may be prepared by those methods disclosed above for components (I) and (II), by varying appropriate starting materials. One skilled in the art would be able to manufacture suitable fluoroorganosilicones for component (IV) without undue experimentation.

(V) Adhesion Promoter

Component (V) is an adhesion promoter. Component (V) is added to the composition in an amount sufficient to impart adhesion to a cured silicone prepared by curing the composition. Component (IV) and component (V) are added to the composition in combination in amounts sufficient to provide resistance to Bleed to a cured silicone prepared by curing the composition. Component (V) may be added to the composition in an amount of 0.01 to 50 weight parts based on the weight of the composition, alternatively 0.05 to 2 weight parts, alternatively 0.5 to 1.5 weight parts.

Component (V) may comprise a transition metal chelate, an alkoxysilane, a combination of an alkoxysilane and a hydroxy-functional polyorganosiloxane, or a combination thereof.

Component (V) can be an unsaturated or epoxy-functional compound. Suitable epoxy-functional compounds are known in the art and commercially available, see for example, U.S. Pat. Nos. 4,087,585; 5,194,649; 5,248,715; and 5,744,507 col. 4-5. Component (VI) may comprise an unsaturated or epoxy-functional alkoxysilane. For example, the functional alkoxysilane can have the formula $R^{28}{}_\mu Si(OR^{29})_{(4-\mu)}$, where $\mu$ is 1, 2, or 3, alternatively $\mu$ is 1.

Each $R^{28}$ is independently a monovalent organic group with the proviso that at least one $R^{28}$ is an unsaturated organic group or an epoxy-functional organic group. Epoxy-functional organic groups for $R^{28}$ are exemplified by 3-glycidoxypropyl and (epoxycyclohexyl)ethyl. Unsaturated organic groups for $R^{28}$ are exemplified by 3-methacryloyloxypropyl, 3-acryloyloxypropyl, and unsaturated monovalent hydrocarbon groups such as vinyl, allyl, hexenyl, undecylenyl.

Each $R^{29}$ is independently an unsubstituted, saturated hydrocarbon group of at least 1 carbon atom. $R^{29}$ may have up to 4 carbon atoms, alternatively up to 2 carbon atoms. $R^{29}$ is exemplified by methyl, ethyl, propyl, and butyl.

Examples of suitable epoxy-functional alkoxysilanes include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof.

Component (V) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. Component (V) may comprise a combination of an epoxy-functional alkoxysilane and an epoxy-functional siloxane. For example, component (V) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methyvinyl/dimethylsiloxane copolymer. When used as a physical blend rather than as a reaction product, these components may be stored separately in multiple-part kits.

Suitable transition metal chelates include titanates, zirconates such as zirconium acetylacetonate, aluminum chelates such as aluminum acetylacetonate, and combinations thereof. Transition metal chelates and methods for their preparation are known in the art, see for example, U.S. Pat. No. 5,248,715, EP 0 493 791 A1, and EP 0 497 349 B1.

Optional Components

An optional component may be added to the composition in addition to components (I)-(V). Suitable optional components include (VI) an unsaturated ester-functional compound, (VII) a void reducing agent, (VIII) a pigment, (IX) a filler, (X) a cure modifier, (XI) a rheology modifier, and combinations thereof.

(VI) Unsaturated Ester-Functional Compound

Component (VI) is an unsaturated ester-functional compound, i.e., an organic compound having at least one ester group per molecule and at least one unsaturated group per molecule capable of undergoing hydrosilylation. Component (VI) may comprise:

vi) a combination thereof.

In formula i), each $R^{16}$ is independently a hydrogen atom, a monovalent hydrocarbon group of 1 to 4 carbon atoms, or $CF_3$ Examples of monovalent hydrocarbon groups for $R^{16}$ include alkyl groups such as methyl, ethyl, propyl, and butyl. Each $R^{17}$ is independently a hydrogen atom, a monovalent organic group, with the proviso that not all $R^{17}$ are hydrogen atoms, or a metal ion. Examples of monovalent organic groups for $R^{17}$ include monovalent hydrocarbon groups, fluoroalkyl groups, epoxy functional groups, and polyether groups. Examples of monovalent hydrocarbon groups include, but are not limited to, alkyl such as methyl, ethyl, propyl, pentyl, octyl, undecyl, dodecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl. Examples of epoxy-functional groups for $R^{17}$ include 3-glycidoxypropyl. Examples of fluoroalkyl groups for $R^{17}$ include but are not limited to $-(CH_2)_x(CF_2)_yCF_3$ where x has an average value of 0 to 20 and y has an average value of 0 to 20, branched fluoroalkyl groups such as perfluoro t-butyl, and cyclic fluoroalkyl groups such as perfluorocyclohexyl, and fluoroaryl groups such as perfluorophenyl. Examples of polyether groups for $R^{17}$ include, but are not limited to, $-(CH_2CH_2O)_zCH_2CH_3$, $-(CH(CH_3)CH_2O)_zCH(CH_3)$ $-(CH2CH_2O)_zCH_2CH=CH_2$, $-(CH(CH_3)CH_2O)_zCH_2CH=CH_2$, $-(CH_2CH_2CH_2CH_2O)_zCH_2CH_3$, $-(CH_2CH_2CH_2CH_2O)_zCH=CH_2$, $-(CH_2CH_2O)_zCH_2CH_2OH$, $-(CH(CH_3)CH_2O)_zCH(CH_3)CH_2-OH$, $-(CH_2CH_2O)_zCH_2CH_2OCH_3$, and $-(CH(CH_3)CH_2O)_zCH(CH_3)CH_2-OCH_3$ where z has an average value of 1 to 20, and cyclic ethers such as tetrahydrofurfuryl and 2-(caprolactone)ethyl. Examples of fluoropolyether groups for $R^{17}$ include, but are not limited to, $-(CF_2-CF_2-O)_zH$, $-(CF(CF_3)CF_2O)_zH$, $-)CF_2CF_2O)_zCF_3$, $-(CF(CF_3)CF_2O)_zCF_3$, where z is as defined above, $-(CH_2)_i(CF(CF_3))_j-(O-CF(CF_3)_k-F$ where i has an average value of 0 to 10, j has an average value of 0 to 10 and k has an average value of 1 to 20. Examples of metal ions for $R^{17}$ include, but are not limited to, positive ions such as Zn, Al, Ca, Na, Mg and K.

In formula ii), each $R^{18}$ is independently a hydrogen atom, a monovalent hydrocarbon group of 1 to 4 carbon atoms, or $CF_3$. Examples of monovalent hydrocarbon groups for $R^{18}$ include alkyl such as methyl, ethyl, propyl, and butyl. Each $R^{19}$ is independently a divalent organic group of 1 to 20 carbon atoms. Examples of divalent organic groups for $R^{19}$ include, but are not limited to, alkylene such as methylene, ethylene, propylene, pentylene, neo-pentylene, octylene, undecylene, and octadecylene; cycloalkylene such as cylcohexylene; alkenylene such as vinylene, allylene, butenylene, and hexenylene; alkynylene such as ethynylene, propynylene, and butynylene; arylene such as phenylene, tolylene, xylylene, benzylene, and 2-phenylethylene; ether diol derivatives such as $-(CH_2CH_2O)_z-CH_2CH_2-$ and $-CH(CH_3)CH_2O)_z-CH(CH_3)CH_2$ where z is as defined above for $R^{19}$; alkylene/arylene combinations such as 4,4'-isopropylidene diphenyl (also known as Bisphenol "A"). Examples of divalent fluorinated organic groups for $R^{19}$ include, but are not limited to, $-(CH_2)_x(CH(F))_y(CF_2)_z-$, $-(CF_2CF_2O)_z-$, $-(CF(CF_3)CF_2O)_z-$ where x, y, and z are as defined above, perfluorocyclohexyl-1,4-dimethyl, and 4,4'-hexafluoroisopropylidene diphenyl (derived from hexafluoro Bisphenol "A"). Each $R^{20}$ is independently a hydrogen atom or a monovalent hydrocarbon group of 1 to 20 carbon atoms. Examples of monovalent hydrocarbon groups for $R^{20}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

In formula iii), n has an average value of 0 to 3 and m=4-n. Alternatively, n may have a value of 0 to 2. Each $R^{21}$ is independently a hydrogen atom, a monovalent hydrocarbon group of 1 to 20 carbon atoms, a hydroxyl group, or $CF^3$. Examples of monovalent hydrocarbon groups for $R^{21}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

Each $R^{22}$ is independently a hydrogen atom, a monovalent hydrocarbon group of 1 to 4 carbon atoms, or $CF^3$. Examples of monovalent hydrocarbon groups for $R^{22}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

Each $R^{23}$ is independently a hydrogen atom or a monovalent hydrocarbon group of 1 to 20 carbon atoms. Examples of monovalent hydrocarbon groups for $R^{23}$ include, but are not limited to, alkyl such as methyl, ethyl, propyl, pentyl, octyl, undecyl, and octadecyl; cycloalkyl such as cyclohexyl; alkenyl such as vinyl, allyl, butenyl, and hexenyl; alkynyl such as ethynyl, propynyl, and butynyl; and aryl such as phenyl, tolyl, xylyl, benzyl, and 2-phenylethyl.

In formula iv), each $R^{24}$ and each $R^{25}$ are independently a monovalent organic group or a hydrogen atom with the proviso that at least one of $R^{24}$ or $R^{25}$ is unsaturated. Examples of monovalent organic groups for $R^{24}$ include monovalent hydrocarbon groups, fluoroalkyl groups, epoxy functional groups, and polyether groups, all exemplified by those listed for $R^{17}$.

Examples of monovalent organic groups for $R^{25}$ include monovalent hydrocarbon groups, fluoroalkyl groups, epoxy functional groups, and polyether groups, all exemplified, but not limited, by those listed for $R^{17}$. Additional examples of monovalent organic groups for $R^{25}$ include oxygen-bridged monovalent organic groups such as $-O-C(O)O-(CH_2)_o CH=CH_2$ where o has an average value of 0 to 20 and carbon-bridged carbonyl groups such as $-CH_2-C(O)-CH_3$.

In formula v), each $R^{26}$ is independently a monovalent organic group or a hydrogen atom, with the proviso that at least one $R^{26}$ is an aliphatically unsaturated monovalent organic group or a hydrogen atom. Examples of monovalent organic groups for $R^{26}$ include monovalent hydrocarbon groups, fluoroalkyl groups, epoxy functional groups, and polyether groups, all exemplified by those listed for $R^{17}$.

Each $R^{27}$ is independently an oxygen atom or a divalent organic group. Examples of divalent organic groups for $R^{27}$ include divalent hydrocarbon groups, fluoroalkylene groups, epoxy functional groups, and polyether functional groups, all exemplified, but not limited, by those listed for $R^{19}$.

Component (VI) is exemplified by 2-ethylhexylacrylate, 2-ethylhexylmethacrylate, methylacrylate, methylmethacrylate, neopentylglycol diacrylate, neopentylglycoldimethacrylate, glycidyl acrylate, glycidyl methacrylate, allyl acrylate, allyl methacrylate strearyl acrylate, tetrahydrofurfuryl methacrylate, caprolactone acrylate perfluorobutyl acrylate, perfluorobutyl methacrylate, tetrahydroperfluoroacrylate, phenoxyethyl acrylate, phenoxyethyl methacrylate, Bisphenol "A" acrylate, Bisphenol "A" dimethacrylate, ethoxylated Bisphenol "A" acrylate, ethoxylated Bisphenol "A" methacrylate, hexafluoro Bisphenol "A" diacrylate, hexafluoro Bisphenol "A" dimethacrylate, diethyleneglycol diacrylate, diethyleneglycol dimethacrylate, dipropyleneglycol diacrylate, dipropyleneglycol dimethacrylate, polyethyleneglycol diacrylate, polyethyleneglycol dimethacrylate, polypropyleneglycol diacrylate, polypropyleneglycol dimethacrylate, trimethylolpropanetriacrylate, trimethylolpropanetrimethacrylate, ethoxylated trimethylolpropanetriacrylate, ethoxylated trimethylolpropanetrimethacrylate), pentaerythritol triacrylate, pentaerythritol trimethacrylate), pentaerythritol tetraacrylate, pentaerythritol tetramethacrylate, methyl-3-butenoate, allyl methyl carbonate, diallyl pyrocarbonate, allyl acetoacetate, diallyl carbonate, diallyl phthalate, dimethyl itaconate, or a combination thereof.

Component (VI) is added to the composition in an amount of 0.01 to 50 weight parts based on the weight of the composition. Without wishing to be bound by theory, it is thought that component (VI) improves both chemical resistance and the adhesive property of the cured product of the composition.

Unsaturated ester-functional compounds suitable for component (VI) are known in the art and commercially available from, for example, Sartomer Company and Aldrich Chemical Company. One skilled in the art would be able to obtain unsaturated ester-functional compounds without undue experimentation.

Component (VII) Void Reducing Agent

Component (VII) is a void reducing agent. Component (VII) is added to the composition in an amount sufficient to reduce voids. Suitable void reducing agents are known in the art and commercially available, see for example, EP 0 850 997 A2 and U.S. Pat. Nos. 4,273,902 and 5,684,060. Suitable void reducing agents can comprise zeolites, anhydrous aluminum sulfate, molecular sieves (preferably with a pore diameter of 10 Å or less), kieselguhr, silica gel, activated carbon, palladium compounds such as palladium metal, palladium metal supported on a substrate exemplified by carbon or alumina, and organopalladium compounds.

Component (VIII) Pigment

Component (VIII) is a pigment. The amount of component (VIII) added to the composition depends on the type of pigment selected. Component (VIII) may be added to the composition in an amount of 0.001% to 30% based on the weight of the composition. Pigments are known in the art and commercially available. Suitable pigments include carbon blacks, such as LB-1011C carbon black from Williams, chromium oxide pigments, such as Harcros G-6099, titanium dioxides such as those available from DuPont, and UV-active dyes such as (thiophenediyl)bis(t-butylbenzoxazole) which is commercially available under the name UVITEX OB from Ciba Specialty Chemicals.

Component (IX) Filler

Component (IX) is a filler. The amount of component (IX) added to the composition depends on the type of filler selected. Component (IX) may be added to the composition in an amount of 0.1% to 90% based on the weight of the compositions. Suitable fillers include reinforcing fillers such silica, titania, and combinations thereof. Suitable reinforcing fillers are known in the art and commercially available, such as a ground silica sold under the name MIN-U-SIL by U.S. Silica of Berkeley Springs, W. Va. or fumed silica sold under the name CAB-O-SIL by Cabot Corporation of Massachusetts.

Conductive fillers (i.e., fillers that are thermally conductive, electrically conductive, or both) may also be used as component (IX). Suitable conductive fillers include metal particles, metal oxide particles, and a combination thereof. Suitable thermally conductive fillers are exemplified by aluminum nitride; aluminum oxide; barium titanate; beryllium oxide; boron nitride; diamond; graphite; magnesium oxide; metal particulate such as copper, gold, nickel, or silver; silicon carbide; tungsten carbide; zinc oxide, and a combination thereof.

Conductive fillers are known in the art and commercially available, see for example, U.S. Pat. No. 6,169,142 (col. 4, lines 7-33). For example, CB-A20S and Al-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the conductive filler particles is not specifically restricted, however, rounded or spherical particles may prevent viscosity increase to an undesirable level upon high loading of the thermally conductive filler in the composition.

A combination of thermally conductive fillers having differing particle sizes and different particle size distributions may be used. For example, it may be desirable to combine a first conductive filler having a larger average particle size with a second conductive filler having a smaller average particle size in a proportion meeting the closest packing theory distribution curve. This improves packing efficiency and may reduce viscosity and enhance heat transfer.

The thermally conductive filler may optionally be surface treated with a treating agent. Treating agents and treating methods are known in the art, see for example, U.S. Pat. No. 6,169,142 (col. 4, line 42 to col. 5, line 2). The thermally conductive filler may be treated with the treating agent prior to combining the thermally conductive filler with the other components of the composition, or the thermally conductive filler may be treated in situ.

The treating agent can be an alkoxysilane having the formula: $R^{30}_p Si(OR^{31})_{(4-p)}$, where p is 1, 2, or 3; alternatively p is 3. $R^{30}$ is a substituted or unsubstituted monovalent hydrocarbon group of at least 1 carbon atom, alternatively at least 8 carbon atoms. $R^{30}$ has up to 50 carbon atoms, alternatively up to 30 carbon atoms, alternatively up to 18 carbon atoms. $R^{30}$ is exemplified by alkyl groups such as hexyl, octyl, dodecyl, tetradecyl, hexadecyl, and octadecyl; and aromatic groups such as benzyl, phenyl and phenylethyl. $R^{30}$ can be saturated or unsaturated, branched or unbranched, and unsubstituted. $R^{30}$ can be saturated, unbranched, and unsubstituted.

$R^{31}$ is an unsubstituted, saturated hydrocarbon group of at least 1 carbon atom. $R^{31}$ may have up to 4 carbon atoms, alternatively up to 2 carbon atoms. The treating agent is exemplified by hexyltrimethoxysilane, octyltriethoxysilane, decyltrimethoxysilane, dodecyltrimethyoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^{32}O)_d Si(OSiR^{33}_2 R^{34})_{4-d}$. In this formula, d is 1, 2, or 3, alternatively d is 3. Each $R^{32}$ can be an alkyl group. Each $R^{33}$ can be independently selected from saturated and unsaturated monovalent hydrocarbon groups of 1 to 10 carbon atoms. Each $R^{34}$ can be a saturated or unsaturated monovalent hydrocarbon group having at least 11 carbon atoms.

Metal fillers can be treated with alkylthiols such as octadecyl mercaptan and others, and fatty acids such as oleic acid, stearic acid, titanates, titanate coupling agents, zirconate coupling agents, and a combination thereof.

Treatment agents for alumina or passivated aluminum nitride could include alkoxysilyl functional alkylmethyl polysiloxanes (e.g., partial hydrolysis condensate of $R^{35}_b R^{36}_c Si(OR^{37})_{(4-b-c)}$ or cohydrolysis condensates or mixtures), similar materials where the hydrolyzable group would be silazane, acyloxy or oximo. In all of these, a group tethered to Si, such as $R^{35}$ in the formula above, is a long chain unsaturated monovalent hydrocarbon or monovalent aromatic-functional hydrocarbon. $R^{36}$ is a monovalent hydrocarbon group, and $R^{37}$ is a monovalent hydrocarbon group of 1 to 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Component (X) Cure Modifier

Component (X) is a cure modifier. Component (X) can be added to extend the shelf life or working time, or both, of the composition of this invention. Component (X) can be added to raise the curing temperature of the composition. Suitable cure modifiers are known in the art and are commercially available. Component (X) is exemplified by acetylenic alcohols such as methyl butynol, ethynyl cyclohexanol, dimethyl hexynol, and combinations thereof; cycloalkenylsiloxanes such as methylvinylcyclosiloxanes exemplified by 1,3,5,7-tetramethyl-1,3,5,7-tetravinylcyclotetrasiloxane, 1,3,5,7-tetramethyl-1,3,5,7-tetrahexenylcyclotetrasiloxane, and combinations thereof; ene-yne compounds such as 3-methyl-3-penten-1-yne, 3,5-dimethyl-3-hexen-1-yne; triazoles such as benzotriazole; phosphines; mercaptans; hydrazines; amines such as tetramethyl ethylenediamine, dialkyl fumarates, dialkenyl fumarates, dialkoxyalkyl fumarates, maleates, and combinations thereof.

Suitable cure modifiers are disclosed by, for example, U.S. Pat. Nos. 3,445,420; 3,989,667; 4,584,361; and 5,036,117.

The amount of component (X) added to the composition will depend on the particular cure modifier used, the nature and amount of component (III), and the composition of component (II). However, the amount of component (X) may be 0.001% to 10% based on the weight of the composition.

Component (XI) Rheology Modifier

Component (XI) is a rheology modifier. Rheology modifiers can be added to change the thixotropic properties of the composition. Component (XI) is exemplified by flow control additives; reactive diluents; anti-settling agents; alpha-olefins; hydroxyl-terminated silicone-organic copolymers, including but not limited to hydroxyl-terminated polypropyleneoxide-dimethylsiloxane copolymers; and combinations thereof.

Component (XII) Spacer

Component (XII) is a spacer. Spacers can comprise organic particles, inorganic particles, or a combination thereof. Spacers can be thermally conductive, electrically conductive, or both. Spacers can have a particle size of 25 micrometers to 250 micrometers. Spacers can comprise monodisperse beads. The amount of component (XII) depends on various factors including the distribution of particles, pressure to be applied during placement of the composition, temperature of placement, and others. The composition can contain up to 15%, alternatively up to 5% of component (XII) added in addition to, or instead of, a portion of component (IX).

Other Optional Components

Other optional components may be added in addition to, or instead of, all or a portion of those described above, provided the optional component does not prevent the composition from curing to form a silicone product having improved chemical resistance, as described above. Examples of other optional components include, but are not limited to, acid acceptors; anti-oxidants; stabilizers such as magnesium oxide, calcium hydroxide, metal salt additives such as those disclosed in EP 0 950 685 A1, heat stabilizers, and ultra-violet (UV) stabilizers; flame retardants; silylating agents, such as 4-(trimethylsilyloxy)-3-penten-2-one and N-(t-butyl dimethylsilyl)-N-methyltrifluoroacetamide; desiccants, such as zeolites, anhydrous aluminum sulfate, molecular sieves (preferably with a pore diameter of 10 Å or less), kieselguhr, silica gel, and activated carbon; and blowing agents, such as water, methanol, ethanol, iso-propyl alcohol, benzyl alcohol, 1,4 butanediol, 1,5 pentanediol, 1,7 heptanediol, and silanols.

Overall SiH:Vi Ratio

The components in the composition may be selected such that the molar ratio of the total amount of silicon-bonded hydrogen atoms to aliphatically unsaturated groups in the composition ($SiH_{tot}/Vi_{tot}$) is at least 0.3, alternatively at least 0.5, alternatively at least 0.9, and alternatively at least 1.0. $SiH_{tot}/Vi_{tot}$ may be up to 5.0, alternatively up to 3.0, and alternatively up to 2.0. Without wishing to be bound by theory, it is thought that if $SiH_{tot}/Vi_{tot}$ is too low, then the composition may not cure or may not adhere to some substrates.

Kits

The composition may be a one-part composition or a multiple-part composition such as a two-part composition. In a multiple-part composition, components (II) and (III) are stored in separate parts. Any of components (I) and (IV)-(XII) can be added to either or both parts. One skilled in the art would know how to select components for each part without undue experimentation.

When a multiple part composition is prepared, it may be marketed as a kit. The kit may further comprise information or instructions or both as how to use the kit, how to combine the parts, or how to cure the resulting combination, or combinations thereof. For example, a kit comprising Part A and Part B can be prepared as follows.

Part A comprises:
(I) a polyorganosiloxane having an average of at least two unsaturated organic groups per molecule, with the proviso that component (I) is free of fluorine atoms,
(III) a hydrosilylation catalyst,
optionally (IV) a fluoroorganosilicone, with the provisos that
  i) component (IV) has at least one functional group reactive with component (I), component (II), or both, and
  ii) when component (II) is not present in the kit, then component (IV) has an average of at least two silicon-bonded hydrogen atoms per molecule,
optionally (V) an adhesion promoter,
optionally (VI) an unsaturated ester-functional compound,
optionally (VII) a void reducing agent,
optionally (VIII) a pigment,
optionally (IX) a filler,
optionally (X) an cure modifier,
optionally (XI) a rheology modifier, and
optionally (XII) a spacer; and Part B comprises
optionally (I) a polyorganosiloxane having at least two terminally-unsaturated organic groups per molecule,
optionally (II) an organohydrogenpolysiloxane having an average of at least two silicon-bonded hydrogen atoms per molecule, where component (II) is free of fluorine atoms,
optionally (IV) a fluoroorganosilicone, with the proviso that component (IV) has at least one functional group reactive with component (I), component (II), or both,
optionally (V) an adhesion promoter,
optionally (VI) an unsaturated ester-functional compound,
optionally (VII) a void reducing agent,
optionally (VIII) a pigment,
optionally (IX) a filler,
optionally (X) an cure modifier,
optionally (XI) a rheology modifier, and
optionally (XII) a spacer;

with the provisos that
(1) at least one of Part A and Part B contains component (IV),
(2) at least one of Part A and Part B contains component (V), and
(3) Part B contains at least one of components (II), (IV), (V), (VI), (VII), (VIII), (IX), (X), (XI), and (XII).

Part A and Part B can be mixed together in a ratio of Part A:Part B (A:B) of 0.05:1 to 20:1, alternatively 0.1:1 to 10:1, alternatively 1:1 to 5:1.

Method of Making the Composition

The compositions described above can be prepared by mixing the components by any convenient means. For example, the composition can be prepared by mixing all components at ambient temperature. When component (X) is present, component (X) may be added before component (III).

The mixer used is not specifically restricted and will be determined by the viscosity of the components and the composition. Suitable mixers include but are not limited to paddle type mixers, kneader type mixers, non-intrusive mixers such as those reliant on centrifugal motion, and two- and three-roll rubber mills. One skilled in the art would be able to prepare the composition without undue experimentation by the methods disclosed above and in the examples set forth below.

Method of Use

The composition of this invention is useful for a range of applications where modified surface or interface properties, or both, are desired. For example, the compositions described above cure to form a part that can be used as an adhesive; protective coating for electronic circuitry, planar surfaces, fibers or small particles; or gasketing materials. Exposed surfaces of the fully cured or partially cured products of this composition may also be useful as substrates for bonding by another adhesive or for secondary bonding to another substrate (as exemplified by a dry film adhesive).

The composition of this invention cures to form a cured silicone that can be used as an adhesive, such as a die attach adhesive for use in electronics applications. The composition can be cured at ambient or elevated temperature. The composition may be applied to a substrate before or during curing. Exposed surfaces of the fully cured or partially cured products of this invention may also be useful as a substrate for bonding by another adhesive.

Cured products prepared using the compositions of this invention can vary in properties from rigid resins to elastomers to gels, depending upon the types and concentrations of components (I) and (II) and any optional components that are added to the composition. Cured products prepared using the compositions are useful in a variety of end-use applications, for example, as coatings or as molded or extruded articles. The compositions can be applied to substrates by spraying, dipping, pouring, screen printing, extrusion or by the use of a brush, roller or coating bar. The selection of a particular application method will be determined at least in part by the viscosity of the curable composition.

Suitable substrates to which the composition, or cured product thereof, may be applied and which are useful in electronics applications include epoxies, polycarbonates, poly(butylene terephthalate) resins, polyamide resins and blends thereof, such as blends of polyamide resins with syndiotactic polystyrene such as those commercially available from the Dow Chemical Company, of Midland, Mich., U.S.A., acrylonitrile-butadiene-styrenes, styrene-modified poly(phenylene oxides), poly(phenylene sulfides), vinyl esters, polyphthalamides, polyimides, silicon, aluminum, stainless steel alloys, titanium, copper, nickel, silver, gold, and combinations thereof.

The composition of this invention can be used, for adhering two surfaces, such as in lid seal applications. For example, the composition can be used for gluing a plastic lid onto a plastic housing for electronic circuitry in an assembly process by a method comprising:

(1) applying the composition described above onto the plastic housing,
(2) placing the lid over the housing such that the edges of the lid are in contact with the composition, and
(3) curing the assembly to form a sealed housing.

Alternatively, the composition can be used, for example, to coat an electronic circuit board, by method comprising:

(1) applying the composition described above over the electronic circuit board, and
(2) curing the composition to produce a sealed circuit board.

Alternatively, the composition can be used, for example, for die attach applications, in a method comprising:

(1) applying the composition described above on an electronic substrate,
(2) attaching a semiconductor die to the composition,
(3) curing the composition to produce a bonded composite.

The method may further comprise one or more optional steps such as (4) repeating steps (1) to (3) to attach one or more additional semiconductor dice to the semiconductor die, (5) wire bonding the semiconductor die or semiconductor dice, (6) cleaning, for example by exposure to plasma, (7) overmolding the semiconductor die or semiconductor dice with a molding compound, and (8) attaching solder balls to form a finished package. In step (1), the electronic substrate may be, for example, a circuit board, a TAB tape, or other substrate known in the art, or the electronic substrate may be a semiconductor die.

Figure 1:
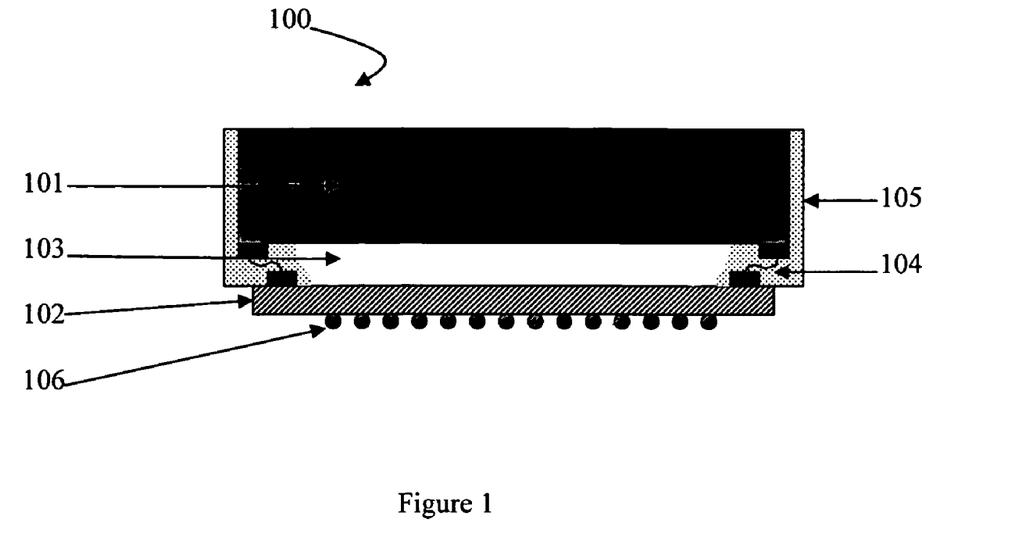
FIG. 1 shows an example of a package in which the composition of this invention is used as a die attach adhesive.

FIG. 1 shows an example of a package 100 prepared according to this method. The package 100 includes a semiconductor die 101 bonded to a substrate 102 shown as a polyimide TAB tape flexible circuit through a die attach adhesive 103 prepared from the composition of this invention. The semiconductor die 101 is electrically connected to the substrate 102 through lead bonds 104. The shapes of the lead bonds 104 are dependent on the height of the semiconductor die 101 from the substrate 102. Encapsulant 105 is used to protect the lead bonds 104. FIG. 1 also shows the solder balls 106, which provide the connection mechanism to the substrate (not shown) on which the package 100 will be mounted.

The composition of this invention may be printed or dispensed on the substrate 402. The semiconductor die 401 may then be placed with pressure and heat onto the composition to prepare the die attach adhesive 403.

Figure 2:
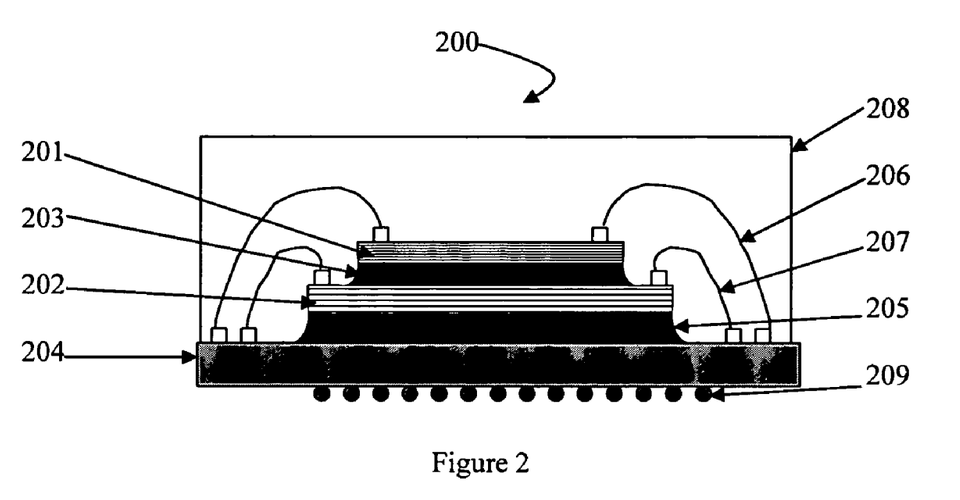
FIG. 2 shows an example of a package in which the composition of this invention is used as a die attach adhesive.

FIG. 2 shows an example of a package 200 prepared according to this method. The package includes a first semiconductor die 201 stacked on top of a second semiconductor die 202 and attached through a first die attach adhesive 203. The second semiconductor die 202 is mounted to a substrate 204 shown in FIG. 2 as a circuit board through a second die attach adhesive 205. The first die attach adhesive 203 and the second die attach adhesive 205 are prepared by curing the composition of this invention. The first die attach adhesive 203 and the second die attach adhesive 205 may be the same or different.

The package 200 may be assembled, for example, by applying a composition according to this invention to the substrate 204. The second semiconductor die 202 may be heated and placed onto the composition with enough pressure to spread the composition uniformly under the second semiconductor die 202. The heat of the die may partially or fully cure the composition to form the second die attach adhesive 205. A composition according to this invention may then be applied to the top of the second semiconductor die 202 and the first semiconductor die 201 may be applied hot to the composition with sufficient pressure, as described above. The composition partially or fully cures to form the first die attach adhesive 203.

The first semiconductor die 201 is electrically connected to the substrate through bonding wires 206 and the second semiconductor die 202 is electrically connected to the substrate through bonding wires 207. An overmolding 208 may then be applied to protect the semiconductor dice 201, 202 and the bonding wires 206, 207. Solder balls 209 may then be added to the substrate 204.

EXAMPLES

These examples illustrate the invention to one of ordinary skill in the art and are not intended to limit the scope of the invention set forth in the claims. The following components are used in the examples:

Filler 1 is fumed silica treated with hexamethyldisilazane.
Filler 2 is spherical fused silica.
Catalyst 1 is a combination of 55% dimethylvinylsiloxy terminated polydimethyl siloxane having a viscosity of 2200 centiStokes (cSt), 45% encapsulated platinum catalyst, and 5% fumed silica treated with hexamethyldisilazane.
Catalyst 2 is polycarbonate encapsulated platinum catalyst.
Cure Modifier is phenyl butynol.
Pigment is Shawnigan Black.
Polymer 1 is a combination of 69% dimethylvinylsiloxy terminated polydimethyl siloxane having a degree of polymerization of 300 and 31% of an MQ resin containing vinyl groups.
Polymer 2 is dimethylvinylsiloxy terminated polydimethyl siloxane having a viscosity of 2200 centiStokes (cSt).
Spacer is styrenedivinylbenzene crosslinked spherical particles having 90% of their diameters being 38 to 45 micrometers.
Organohydrogenpolysiloxane 1 is a trimethylsiloxy-terminated poly(dimethylsiloxane/methylhydrogensiloxane) having a degree of polymerization of 12, and a ratio of dimethylsiloxane units/methyl hydrogensiloxane units of 0.6.
Fluoroorganosilicone 1 is trimethylsiloxy-terminated poly(methylhydrogensiloxane/methyl-6,6,6,5,5,4,4,3,3-nonafluorohexylsiloxane) having an average of 28 methylhydrogensiloxane units and 12 methyl-6,6,6,5,5,4,4,3,3-nonafluorohexyl siloxane units per molecule.
Adhesion Promoter is a reaction product of hydroxy-terminated poly(dimethylsiloxane/methylvinylsiloxane) with (glycidoxypropyl)trimethoxysilane.
Phenylsiloxane 1 is phenylmethylvinylsiloxy terminated polydimethylsiloxane.
Phenylsiloxane 2 is $PhSi(O(CH_3)_2H)$, where Ph represents a phenyl group.

Reference Example 1

Sample Preparation and Analysis

A base is prepared by milling the following components in a 1 quart Ross mixer: Filler 1, Filler 2, Pigment, and the Polymer or Polymers selected for each example.

A blend is prepared by blending Cure Modifier and Organohydrogenpolysiloxane or Fluoroorganosilicone, or both, and heating for at least 30 minutes at 70° C.

The base, the blend, and any additional Polymer or Polymers are combined in a 20 gram dental mixer cup and are mixed at 3,500 revolutions per minute for 30 seconds. The resulting mixture is allowed to cool and Catalyst is added and is hand mixed for 10 seconds. The resulting mixture is again mixed at 3,500 revolutions per minute for 10 seconds with the dental mixer.

Rate of Bleed is measured as follows. A sample is allowed to equilibrate to room temperature. A 9 mm (length) piece of Continuous Au/Cu PI TAB tape purchased from Hitachi Cable is cut and taped to the middle section of a stainless steel print frame that fits in a vacuum plate on the printer. The two edges of this plate will have holes exposed that need to be covered with PI cut to the same geometry as the Hitachi TAB tape. This will effectively seal the SS frame so that the vacuum plate can hold the frame and tape in place. This frame is then loaded into the vacuum plate attached to the printer.

The sample is screen-printed using the "bleed study" stencil. As soon as the print is made and the carriage is unloaded from the printer, the tab edge of the Hitachi TAB tape is taped to the SS frame. This will prevent any flow of material from being affected by the tape's tendency to curl at the edges.

A time of print is noted on the frame, and if an initial photograph is needed, the frame is transferred directly to the TEFLON stage used with the SPOT Microscope.

A tilt of 25-35 degrees will enhance the halo of the bleeding layer on the image captured. The microscope zoom is adjusted from 1 to 4.9×, with the latter giving the best optical reference to measure or quantify the bleed from a nubbin. Once focused on a nubbin at the correct zoom, a picture is taken and the image saved to a file. This process is then repeated after 24 hours.

Quantification of the bleeding layer takes place using Sigma Pro Software. If nubbin slump is an issue, the nubbin diameter may photographed and measured at time=0 then again time=24 hours. The change in diameter of the nubbin can be subtracted from the actual % increase of the bleeding layer.

If the nubbin does not undergo any significant slump then the photo at the end of the time interval is measured alone. If this is the case, the nubbin diameter is measured followed by the diameter of the halo of bleeding material and a percent increase from initial nubbin diameter is calculated.

Examples 1 to 5 and Comparative Examples 1 to 7

Compositions Without Component (II)

Samples are prepared according to the method of Reference Example 1. The ingredients and amounts for examples 1-5 are in Table 1. The ingredients and amounts for comparative examples 1-7 are in Table 2. Extent of Bleed is measured as % change after 24 hours. The results are in Tables 1 and 2.

TABLE 1

Example Ingredients in Weight % of the Composition

| | Example # | | | | |
|---|---|---|---|---|---|
| | 1 | 2 | 3 | 4 | 5 |
| Polymer 1 | 33.31 | 32.68 | 32.05 | 31.74 | 31.43 |
| Adhesion Promoter | 0.40 | 0.80 | 1.20 | 1.40 | 1.60 |
| Pigment | 0.40 | 0.40 | 0.40 | 0.40 | 0.40 |
| Filler 1 | 1.00 | 1.00 | 1.00 | 1.00 | 1.00 |
| Filler 2 | 60.00 | 60.00 | 60.00 | 60.00 | 60.00 |
| Fluoroorganosilicone 1 | 3.57 | 3.80 | 4.03 | 4.14 | 4.25 |
| Cure Modifier | 0.05 | 0.05 | 0.05 | 0.05 | 0.05 |
| Catalyst 1 | 1.27 | 1.27 | 1.27 | 1.27 | 1.27 |
| Extent of Bleed | 0.0% | 0.0% | 15.9% | 32.0% | 19.1% |

TABLE 2

Comparative Example Ingredients in Weight % of the Composition

| | Com Ex # | | | | | | |
|---|---|---|---|---|---|---|---|
| | 1 | 2 | 3 | 4 | 5 | 6 | 7 |
| Polymer 1 | 35.35 | 34.82 | 34.29 | 33.76 | 33.49 | 33.23 | 33.93 |
| Adhesion Promoter | 0.00 | 0.40 | 0.80 | 1.20 | 1.40 | 1.60 | 0.00 |
| Pigment | 0.40 | 0.40 | 0.40 | 0.40 | 0.40 | 0.40 | 0.40 |
| Filler 1 | 1.00 | 1.00 | 1.00 | 1.00 | 1.00 | 1.00 | 1.00 |
| Filler 2 | 60.00 | 60.00 | 60.00 | 60.00 | 60.00 | 60.00 | 60.00 |
| Organohydrogenpolysiloxane 1 | 1.93 | 2.06 | 2.19 | 2.32 | 2.39 | 2.45 | 0.00 |
| Fluoro-organosilicone 1 | 0.00 | 0.00 | 0.00 | 0.00 | 0.00 | 0.00 | 3.35 |
| Cure Modifier | 0.05 | 0.05 | 0.05 | 0.05 | 0.05 | 0.05 | 0.05 |
| Catalyst 1 | 1.27 | 1.27 | 1.27 | 1.27 | 1.27 | 1.27 | 1.27 |
| Extent of Bleed | 77.4% | 100.7% | 133.1% | 207.2% | 248.0% | 284.0% | 0.0% |

Comparative example 1 shows that Bleed occurs in a composition that contains no fluoroorganosilicone and no adhesion promoter. Comparative example 1 and comparative examples 2-6 show that as the amount of adhesion promoter in the composition increases, Bleed also increases, even though the ratio of silicon-bonded hydrogen to aliphatically unsaturated organic groups is constant. Comparative examples 1-7 show that when a fluoroorganosilicone is added to the composition of comparative example 1, Bleed decreases. Example 1 and comparative examples 1-7 show that even though adhesion promoter is present, Bleed does not increase when both fluoroorganosilicone and adhesion promoter are present. Examples 1-6 and comparative examples 1-6 show that when both fluoroorganosilicone and adhesion promoter are present, Bleed is reduced as compared to when both fluoroorganosilicone and adhesion promoter are absent and when fluoroorganosilicone is absent and adhesion promoter is present the composition.

Examples 6-8

Compositions Containing Component (II)

Samples are prepared according to the method of Reference Example 1. The components and amounts for examples 6-8 are in Table 3. Extent of Bleed is measured as % change after 24 hours. The results are in Table 3.

TABLE 3

| | Example # | | |
|---|---|---|---|
| | 6 | 7 | 8 |
| Polymer 1 | 33.26 | 32.96 | 32.83 |
| Adhesion Promoter | 0.8 | 0.8 | 0.8 |
| Pigment | 0.4 | 0.4 | 0.4 |
| Filler 1 | 1 | 1 | 1 |
| Filler 2 | 60 | 60 | 60 |
| Organohydrogenpolysiloxane 1 | 0.8 | 0.4 | 0.2 |
| Fluoroorganosilicone 1 | 2.42 | 3.12 | 3.45 |
| Cure Modifier | 0.05 | 0.05 | 0.05 |
| Catalyst 1 | 1.27 | 1.27 | 1.27 |
| Extent of Bleed | 13.2% | 17.8% | 16.6% |
| $SiH_{tot}/Vi_{tot}$ | 1.50 | 1.50 | 1.50 |

As shown in the examples and comparative examples above, compositions containing adhesion promoters but no fluoroorganosilicones exhibit greater Bleed than the compositions that contain neither adhesion promoters nor fluoroorganosilicones and the compositions that contain fluoroorganosilicones but no adhesion promoters. However, it was surprisingly found that the compositions containing both adhesion promoters and fluoroorganosilicones exhibit less Bleed than the compositions containing fluoroorganosilicones and no adhesion promoters.

Reference Example 2

Sample Preparation and Analysis

Samples are prepared by combining Polymer 2, Pigment, Spacer, filler 2, Crosslinker 1, Adhesion Promoter, Catalyst 2, Adhesion Promoter, and any Phenylsiloxanes and Crosslinkers.

Bleed is measured as the percent increase in diameter of a dot of sample placed on an electronic circuit tape. The circuit tape is Hitachi polyimide TAB Tape LC-TAB μBGA 220A14, which consists of gold plated copper circuit traces with Tomoegawa X epoxy laminate adhesive between the traces. Dots of sample with diameters ranging from 0.914 mm to 1.953 mm are placed on to the epoxy surface on this circuit tape. Immediately after the dots are applied to the epoxy surface, pictures of the dots are taken and the time of placement is recorded along with the picture.

As time passes, subsequent pictures of the dots are taken using identical magnifications. All pictures are taken with a Nikon sMZ-10A microscope, a Diagnostic Instruments, Inc. Spot Jr Model 1.5.0 digital camera, and Diagnostic Instruments, Inc. Spot 32 software.

Using CorelDraw 7 Version 7.373 software and a standard length recorded with each picture, the diameter of the dots are recorded over time. As time passes, each dot grew due to Bleed of silicone species from the dot on the epoxy surface. There is no change in the size of the original dots. The material bleeding from the edge of the dot is due to Bleed of silicone species, not flow of the bulk of the dot.

Therefore, the growth in the size of the diameter in relation to the diameter of the original dot is an indication of the relative amount of Bleed for a given formulation.

Comparative Examples 8-15

Samples are prepared according to the method of Reference Example 2. The ingredients and amounts (in weight %) are shown in Table 4. Extent of Bleed is measured % change 5 times over 35 to 38 minutes. The results are in Table 5.

TABLE 4

| | Comparative Example # | | | | | | | |
|---|---|---|---|---|---|---|---|---|
| | 8 | 9 | 10 | 11 | 12 | 13 | 14 | 15 |
| Polymer 2 | 44.32 | 44.33 | 44.35 | 44.38 | 44.37 | 44.40 | 43.26 | 39.29 |
| Phenyl-siloxane 1 | 0 | 0 | 0 | 0 | 0 | 0 | 1.04 | 5.01 |
| Pigment | 0.30 | 0.30 | 0.30 | 0.30 | 0.30 | 0.30 | 0.30 | 0.30 |
| Spacer | 3.00 | 3.00 | 3.02 | 3.02 | 3.00 | 3.00 | 3.00 | 3.03 |
| Filler 2 | 50.00 | 50.00 | 50.00 | 49.98 | 49.99 | 49.99 | 49.94 | 49.97 |
| Phenyl-siloxane 2 | 0 | 0.10 | 0.30 | 0.51 | 0.62 | 0.77 | 0 | 0 |
| Crosslinker 1 | 0.84 | 0.74 | 0.51 | 0.28 | 0.18 | 0 | 0.93 | 0.86 |
| Adhesion Promoter | 0.97 | 0.96 | 0.97 | 0.97 | 0.98 | 0.98 | 0.96 | 0.97 |
| Catalyst 2 | 0.57 | 0.56 | 0.56 | 0.56 | 0.57 | 0.57 | 0.58 | 0.57 |
| $SiH_{tot}/Vi_{tot}$ | 1.20 | 1.20 | 1.20 | 1.20 | 1.20 | 1.20 | 1.20 | 1.20 |

TABLE 5

| | Comparative Example # | | | | | | | |
|---|---|---|---|---|---|---|---|---|
| | 8 | 9 | 10 | 11 | 12 | 13 | 14 | 15 |
| Time of Test 1 (min) | 0 | 0 | 0 | 0 | 0 | 0 | 0 | 0 |
| Extent of Bleed of Test 1 (%) | 0 | 0 | 0 | 0 | 0 | 0 | 0 | 0 |
| Time of Test 2 (min) | 9 | 9 | 7 | 9 | 9 | 9 | 9 | 9 |
| Extent of Bleed of Test 2 (%) | 24 | 23 | 36 | 39 | 39 | 40 | 34 | 36 |
| Time of Test 3 (min) | 18 | 18 | 15 | 18 | 18 | 18 | 18 | 18 |
| Extent of Bleed of Test 3 (%) | 36 | 43 | 56 | 61 | 55 | 62 | 53 | 57 |
| Time of Test 4 (min) | 27 | 29 | 24 | 29 | 27 | 28 | 27 | 27 |
| Extent of Bleed of Test 4 (%) | 46 | 63 | 74 | Not measured | 71 | 75 | 66 | 71 |
| Time of Test 5 (min) | 36 | 38 | 35 | 36 | 36 | 36 | 36 | 36 |
| Extent of Bleed of Test 5 (%) | 54 | 77 | 92 | 93 | 86 | 89 | 75 | 83 |

Comparative examples 8-15 show that when a phenylsiloxane is used instead of a fluoroorganosilicone, Bleed increases.

REFERENCE NUMERALS

100 package
101 semiconductor die
102 substrate
103 die attach adhesive
104 lead bonds
105 encapsulant
106 solder balls
200 package
201 first semiconductor die
202 second semiconductor die
203 first die attach adhesive
204 substrate
205 second die attach adhesive
206 bonding wires
207 bonding wires
208 overmolding
209 solder balls

The invention claimed is:

1. A method comprising:
   (1) applying a composition over an electronic circuit board, and
   (2) curing the composition to produce a sealed circuit board;
   where the composition is prepared by mixing components comprising:
   (I) a polyorganosiloxane having an average of at least two unsaturated organic groups per molecule,
      with the proviso that component (I) is free of fluorine atoms;
   optionally (II) an organohydrogenpolysiloxane having an average of at least two silicon-bonded hydrogen atoms per molecule,
      with the proviso that component (II) is free of fluorine atoms;
   (III) a hydrosilylation catalyst;
   (IV) a fluoroorganosilicone,
      with the provisos that
      (1) component (IV) has at least one functional group reactive with component (I), component (II), or both,
      (2) when component (II) is not present, then component (IV) has an average of at least two silicon-bonded hydrogen atoms per molecule, and
      (3) component (IV) is added to the composition in an amount sufficient to provide chemical resistance to a cured product of the composition; and
   (V) an adhesion promoter comprising a reaction product of a hydroxy-terminated polyorganosiloxane with an epoxy-functional alkoxysilane or an unsaturated alkoxysilane, or a physical blend of a hydroxy-terminated polyorganosiloxane with an epoxy-functional alkoxysilane or an unsaturated alkoxysilane,
   with the proviso that component (IV) and component (V) are added to the composition in amounts sufficient to provide resistance to Bleed to the composition.

2. The method of claim 1, where the substrate comprises an epoxy, a polycarbonate, a poly(butylene terephthalate) resin, a polyamide resin, a blend of polyamide resin with syndiotactic polystyrene, an acrylonitrile-butadiene- styrene, a styrene-modified poly(phenylene oxide), a poly(phenylene sulfide), a vinyl ester, a polyphthalamide, a polyimide, silicon, aluminum, a stainless steel alloy, titanium, copper, nickel, silver, gold, or combinations thereof.

3. The method of claim 1, where component (V) comprises an alkoxysilane of the formula $R^{28}{}_\mu Si(OR^{29})_{(4-\mu)}$, where
   $\mu$ is 1, 2, or 3,
   each $R^{28}$ is independently a monovalent organic group, with the proviso that at least one $R^{28}$ is an unsaturated organic group or an epoxy-functional group, and
   each $R^{29}$ is independently an unsubstituted, saturated hydrocarbon group of at least 1 carbon atom.

4. A method comprising:
   (1) applying a composition on an electronic substrate,
   (2) attaching a semiconductor die to the composition,
   (3) curing the composition to produce a bonded composite,
   optionally (4) repeating steps (1) to (3) to attach one or more additional semiconductor dice to the semiconductor die,
   optionally (5) wire bonding the semiconductor die or semiconductor dice,
   optionally (6) cleaning,
   optionally (7) overmolding the semiconductor die or semiconductor dice with a molding compound, and
   optionally (8) attaching solder balls to form a finished package;

where the composition is prepared by mixing components comprising:
(I) a polyorganosiloxane having an average of at least two unsaturated organic groups per molecule,
with the proviso that component (I) is free of fluorine atoms;
optionally (II) an organohydrogenpolysiloxane having an average of at least two silicon-bonded hydrogen atoms per molecule,
with the proviso that component (II) is free of fluorine atoms;
(III) a hydrosilylation catalyst;
(IV) a fluoroorganosilicone,
with the provisos that
(1) component (IV) has at least one functional group reactive with component (I), component (II), or both,
(2) when component (II) is not present, then component (IV) has an average of at least two silicon-bonded hydrogen atoms per molecule, and
(3) component (IV) is added to the composition in an amount sufficient to provide chemical resistance to a cured product of the composition; and
(V) an adhesion promoter compriding a reaction product of a hydroxy-terminated polyorganosiloxane with an epoxy-functional alkoxysilane or an unsaturated alkoxysilane, or a physical blend of hydroxy-terminated polyorganosiloxane with an epoxy-functional alkoxysilane or an unsaturated alkoxysilane,
with the proviso that component (IV) and component (V) are added to the composition in amounts sufficient to provide resistance to Bleed to the composition.

5. The method of claim 4, where the substrate comprises an epoxy, a polycarbonate, a poly(butylene terephthalate) resin, a polyamide resin, a blend of polyamide resin with syndiotactic polystyrene, an acrylonitrile-butadiene- styrene, a styrene-modified poly(phenylene oxide), a poly(phenylene sulfide), a vinyl ester, a polyphthalamide, a polyimide, silicon, aluminum, a stainless steel alloy, titanium, copper, nickel, silver, gold, or combinations thereof.

6. The method of claim 4, where component (I) comprises a polyorganosiloxane of the formula:
(a) $R^1_3SiO(R^1_2SiO)_\alpha(R^1R^2SiO)_\beta SiR^1_3$,
(b) $R^3_2R^4SiO(R^3_2SiO)_\chi(R^3R^4SiO)_\delta SiR^3_2R^4$, or
(c) a combination thereof, where
$\alpha$ has an average value of 0 to 2000,
$\beta$ has an average value of 2 to 2000,
each $R^1$ is independently a monovalent organic group,
each $R^2$ is independently an unsaturated monovalent organic group,
$\chi$ has an average value of 0 to 2000,
$\delta$ has an average value of 0 to 2000,
each $R^3$ is independently a monovalent organic group, and
each $R^4$ is independently an unsaturated monovalent organic group.

7. The method of claim 4, where component (I) comprises an MQ resin consisting essentially of $R^5_3SiO_{1/2}$ units and $SiO_{4/2}$ units, a TD resin consisting essentially of $R^5SiO_{3/2}$ units and $R^5_2SiO_{2/2}$ units, an MT resin consisting essentially of $R^5_3SiO_{1/2}$ units and $R^5SiO_{3/2}$ units, an MTD resin consisting essentially of $R^5_3SiO_{1/2}$ units, $R^5SiO_{3/2}$ units, and $R^5_2SiO_{2/2}$ units, or a combination thereof, where
each $R^5$ is a monovalent organic group of 1 to 20 carbon atoms, and
the resin contains an average of 3 to 30 mole percent of unsaturated organic groups.

8. The method of claim 4, where component (II) is present and component (II) comprises siloxane units selected from $HR^6_2SiO_{1/2}$, $R^6_3SiO_{1/2}$, $HR^6SiO_{2/2}$, $R^6_2SiO_{2/2}$, $R^6SiO_{3/2}$, $SiO_{4/2}$, or combinations thereof; where each $R^6$ is independently selected from monovalent organic groups free of aliphatic unsaturation.

9. The method of claim 4, where component (II) is present and component (II) comprises a compound of the formula:
(a) $R^7_3SiO(R^7_2SiO)_\epsilon(R^7HSiO)_\varnothing SiR^7_3$, or
(b) $R^8_2HSiO(R^8_2SiO)_\gamma(R^8HSiO)_\eta SiR^8_2H$,
(c) a combination thereof, where
$\epsilon$ has an average value of 0 to 2000,
$\varnothing$ has an average value of 2 to 2000,
each $R^7$ is independently a monovalent organic group free of aliphatic unsaturation,
$\gamma$ has an average value of 0 to 2000,
$\eta$ has an average value of 0 to 2000, and
each $R^8$ is independently a monovalent organic group free of aliphatic unsaturation.

10. The method of claim 4, where component (III) comprises a platinum metal, a rhodium metal, or an organometallic compound.

11. The method of claim 4, where component (III) comprises a microencapsulated hydrosilylation catalyst.

12. The method of claim 4, where component (IV) comprises a compound of the formula:
(a) $R^9_3SiO(R^9_2SiO)_\iota(R^9R^{10}SiO)_\phi SiR^9_3$,
(b) $R^{11}_2R^{12}SiO(R^{11}_2SiO)_\kappa(R^{11}R^{12}SiO)_\lambda SiR^{11}_2R^{12}$,
(c) $F_3C(CF_2)_vR^{13}-Si-[O-Si(R^{14})_2(R^{15})]_3$,
(d) a resinous or branched structure consisting essentially of $R^{15}R^{14}_2SiO_{1/2}$ units, $CF_3(CF_2)vR^{13}SiO_{3/2}$ units, and optionally $SiO_{4/2}$ units, or
(e) a combination thereof; where
$\iota$ has an average value of 0 to 2000,
$\phi$ has an average value of 1 to 500,
each $R^9$ is independently a hydrogen atom or a monovalent organic group, with the proviso that at least one $R^9$ is a hydrogen atom or an unsaturated monovalent organic group;
each $R^{10}$ is independently a fluoro-functional organic group;
$\kappa$ has an average value of 0 to 2000;
$\lambda$ has an average value of 0 to 500;
each $R^{11}$ is independently a hydrogen atom or a monovalent organic group, with the proviso that at least one $R^{11}$ is a hydrogen atom or an unsaturated monovalent organic group;
each $R^{12}$ is independently a fluoro-functional organic group;
each $R^{13}$ is independently a divalent organic group;
each $R^{14}$ is independently a monovalent hydrocarbon group free of aliphatic unsaturation;
v is 0 to 10; and
each $R^{15}$ is independently a hydrogen atom or an unsaturated monovalent organic group.

13. The method of claim 4, where component (V) comprises an alkoxysilane of the formula $R^{28}_\mu Si(OR^{29})_{(4-\mu)}$, where
$\mu$ is 1, 2, or 3,
each $R^{28}$ is independently a monovalent organic group, with the proviso that at least one $R^{28}$ is an unsaturated organic group or an epoxy-functional group, and
each $R^{29}$ is independently an unsubstituted, saturated hydrocarbon group of at least 1 carbon atom.

14. The method of claim 4, where the composition further comprises an acid acceptor, an anti-oxidant, a stabilizer, a flame retardant, a flow control additive, a reactive diluent, an anti-settling agent, a silylating agent, a desiccant, a blowing agent, or combinations thereof.

* * * * *